(12) United States Patent
Hirata et al.

(10) Patent No.: US 7,586,290 B2
(45) Date of Patent: Sep. 8, 2009

(54) BATTERY STATE OF CHARGE DETECTION

(75) Inventors: Takeshi Hirata, Zama (JP); Tsuyoshi Yamanaka, Yamato (JP); Yuji Nakada, Tokyo (JP)

(73) Assignee: Nissan Motor Co., Ltd., Yokohama-shi (JP)

( * ) Notice: Subject to any disclaimer, the term of this patent is extended or adjusted under 35 U.S.C. 154(b) by 264 days.

(21) Appl. No.: 11/149,587

(22) Filed: Jun. 10, 2005

(65) Prior Publication Data

US 2005/0280396 A1     Dec. 22, 2005

(30) Foreign Application Priority Data

Jun. 11, 2004   (JP) .............................. 2004-174055

(51) Int. Cl.
    *H02J 7/00*     (2006.01)
(52) U.S. Cl. ..................... 320/132; 180/65.3; 701/22
(58) Field of Classification Search ................. 320/132, 320/127, 149, 13, 123; 318/800–801, 138–139, 318/432, 98; 307/2, 19, 9.1, 10.1; 340/636.12, 340/636.13; 324/430; 180/65.3; 701/22; 903/903, 904, 905, 906, 907, 908
See application file for complete search history.

(56) References Cited

U.S. PATENT DOCUMENTS

| | | | | |
|---|---|---|---|---|
| 6,091,228 A * | 7/2000 | Chady et al. | ............... | 320/132 |
| 6,232,744 B1 * | 5/2001 | Kawai et al. | ............... | 320/132 |
| 6,366,838 B1 * | 4/2002 | Yoshino et al. | ............... | 701/22 |
| 6,659,213 B2 * | 12/2003 | Kubo et al. | ............... | 180/65.26 |
| 6,701,229 B2 * | 3/2004 | Iwasaki | ............... | 701/22 |
| 6,911,831 B2 * | 6/2005 | Tsutsui | ............... | 324/713 |
| 2003/0042866 A1 * | 3/2003 | Minamiura et al. | ......... | 320/104 |
| 2003/0052650 A1 * | 3/2003 | Gunji | ............... | 320/155 |
| 2003/0067282 A1 * | 4/2003 | Arai et al. | ............... | 320/132 |
| 2003/0231005 A1 * | 12/2003 | Kohama et al. | ............... | 320/132 |
| 2004/0212351 A1 * | 10/2004 | Kneifel et al. | ............... | 320/149 |
| 2004/0257045 A1 * | 12/2004 | Sada et al. | ............... | 320/132 |
| 2005/0269991 A1 | 12/2005 | Mitsui et al. | | |

FOREIGN PATENT DOCUMENTS

| | | |
|---|---|---|
| JP | 9-84205 A | 3/1997 |
| JP | 9-308117 A | 11/1997 |
| JP | 11-38104 A | 2/1999 |
| JP | 2001-74786 A | 3/2001 |
| JP | 2001-339863 A | 12/2001 |
| JP | 2004-93551 A | 3/2004 |
| JP | 2004-127670 A | 4/2004 |

* cited by examiner

*Primary Examiner*—Akm E Ullah
*Assistant Examiner*—M'Baye Diao
(74) *Attorney, Agent, or Firm*—Foley & Lardner LLP

(57) ABSTRACT

A state of charge of a battery (1) that drives a motor (6) is computed based on a discharge current measured by a current sensor (3) when the discharge current of the battery (1) does not exceed a rated discharge range of the battery (1). When the discharge current of the battery (1) exceeds the rated discharge range, the state of charge of the battery (1) is computed by estimating the discharge current of the battery (1) from a motor control signal, whereby current changes over a wide range can be found with good precision using the sensor (3), which has a narrow but high resolution measurable range, and the state of charge can be accurately detected.

7 Claims, 5 Drawing Sheets

BATTERY STATE OF CHARGE DETECTION

FIELD OF THE INVENTION

This invention relates to detection of the state of charge of a battery for an electric vehicle or a hybrid-drive vehicle.

BACKGROUND OF THE INVENTION

JP 9-84205 A, published by the Japan Patent Office in 1997, discloses a device that computes a state of charge (hereinafter abbreviated to "SOC") for a battery by measuring a battery discharge current and adding up current values.

The battery SOC is computed by using electric current sensors capable of covering both a rated discharge range at which the battery is capable of producing continuous discharge, and a high power instantaneous rated discharge range where the battery is capable of performing discharge for a short period of time.

SUMMARY OF THE INVENTION

Expanding the range over which the current sensor takes measurements causes a decrease in the resolution of the sensor, and this causes the computation precision for the SOC to decrease.

On the other hand, a current sensor that covers only the rated discharge range has superior measurement precision because the range over which measurements can be made is small. However, the current in the instantaneous rated discharge range cannot be measured.

It is therefore an object of this invention to increase the detection precision for the SOC across a wide range.

In order to achieve the above object, this invention provides a battery state of charge detection device for use with an electric circuit that drives a motor by using a current supplied from a battery. The electric circuit comprises an inverter that controls operation of the motor and a controller that outputs a motor control signal to the inverter to supply from the battery to the motor a current corresponding to a requested output to the motor. The battery has a rated discharge range relating to a discharge current. The battery state of charge detection device comprises a first current sensor that detects a discharge current of the battery, the first current sensor having a measurable current range that slightly exceeds an upper limit value of the rated discharge range, and a microprocessor programmed to determine whether or not the current detected by the first current sensor exceeds the upper limit value, compute a state of charge of the battery based on the motor control signal when the current detected by the first current sensor exceeds the upper limit value, and compute the state of charge of the battery based on a current value detected by the first current sensor when the current detected by the first current sensor does not exceed the upper limit value.

This invention also provides a battery state charge detection method comprising detecting a discharge current of the battery by using a current sensor having a measurable current range that slightly exceeds an upper limit value of the rated discharge range, determining whether or not the current detected by the current sensor exceeds the upper limit value, computing a state of charge of the battery based on the motor control signal when the current detected by the current sensor exceeds the upper limit value, and computing the state of charge of the battery based on a current value detected by the current sensor when the current detected by the current sensor does not exceed the upper limit value.

The details as well as other features and advantages of this invention are set forth in the remainder of the specification and are shown in the accompanying drawings.

DETAILED DESCRIPTION OF THE PREFERRED EMBODIMENTS

This invention is capable of being applied to a motor driver circuit of an electric vehicle, a hybrid-drive vehicle, or the like. Embodiments of this invention as applied to a motor driver circuit like those described above are explained below.

Figure 1:
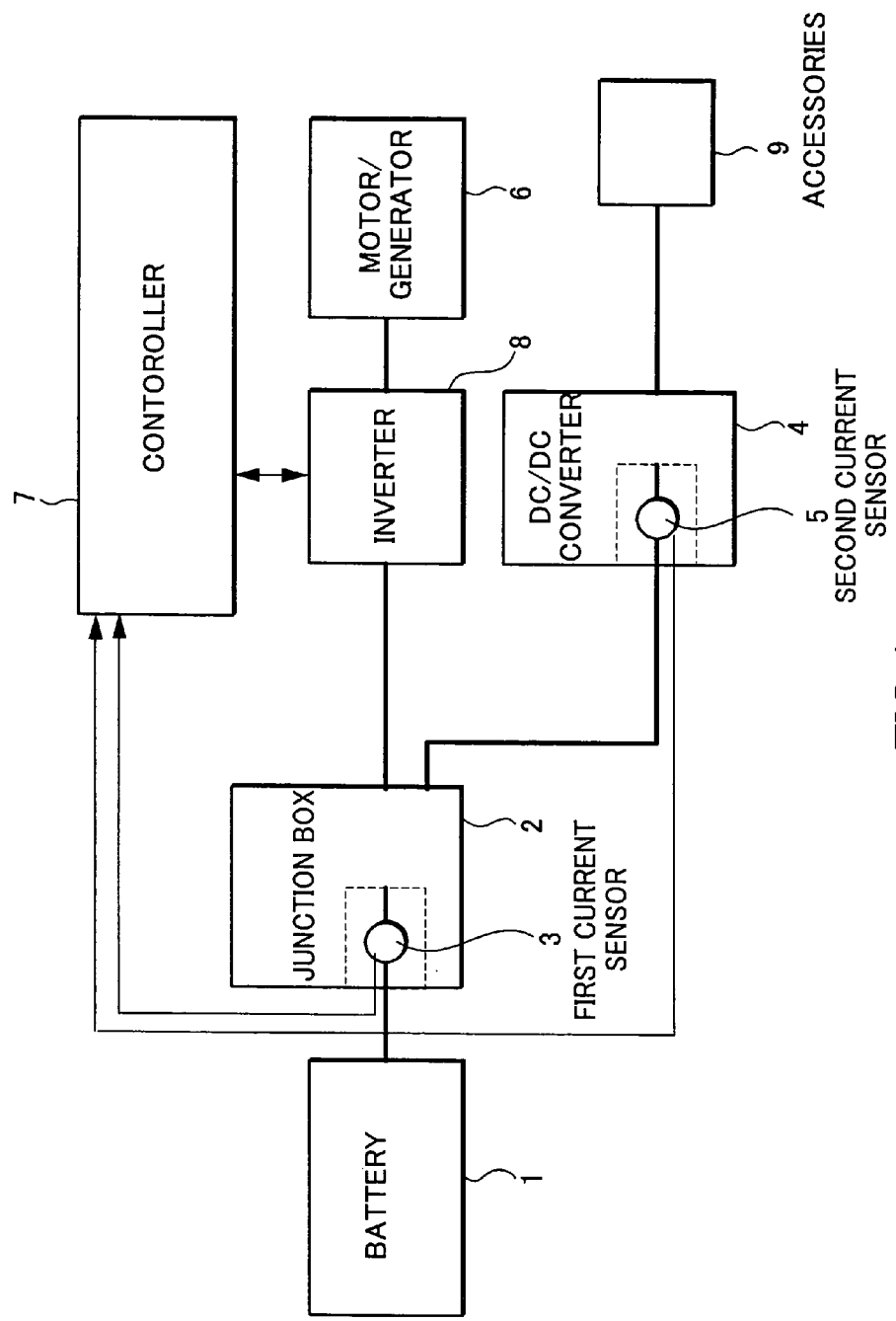
FIG. 1 is a schematic diagram of an SOC detection device according to this invention.

Referring to FIG. 1 of the drawings, a driver circuit of a motor/generator 6 used in driving a vehicle comprises a battery 1, a junction box 2, a DC/DC converter 4, and a controller 7.

The battery 1 supplies a direct current to an inverter 8 through the junction box 2. The inverter 8 converts the direct current supplied from the battery 1 into an alternating current, and supplies the alternating current to the motor/generator 6.

The battery 1 supplies a direct current to the DC/DC converter 4 through the junction box 2. The DC/DC converter 4 converts a voltage of the direct current supplied from the battery 1 into a lower voltage, and supplies the direct current to the accessories 9.

The motor/generator 6 rotates due to the alternating current supplied from the battery 1 through the inverter 8, and imparts a drive force to the vehicle. The motor/generator 6 recovers regenerative energy when the vehicle decelerates, or generates electricity consuming the drive force. The battery 1 is charged with the generated electricity.

The controller 7 comprises a microcomputer comprising a central processing unit (CPU), a read only memory (ROM), a random access memory (RAM), and an input/output interface (I/O interface). It is also possible to configure the controller 7 using a plurality of microcomputers.

The controller 7 controls a torque and a rotational speed of the motor/generator 6 by outputting a motor/generator control command to the inverter 8. Further, the motor driver circuit further comprises a first current sensor 3 and a second current sensor 5 in order to perform the control described above.

The first current sensor 3 is provided within the junction box 2, and measures a discharge current and a charge current of the battery 1. The first current sensor 3 outputs measured values to the controller 7 as signals.

A rated discharge range used over a long period of time and an instantaneous rated discharge range whose use is limited to a short period of time exist as discharge ranges for the battery 1. The range over which the first current sensor 3 is capable of taking measurements covers the rated discharge range, but is much narrower than the instantaneous rated discharge range. In practice, an upper limit value which the first current sensor 3 is capable of measuring is set to exceed an upper limit value Imax of the rated discharge range by a small amount. By thus setting the range that the first current sensor 3 is capable of measuring to a narrow range, the measurement precision for currents within the measurable range can be increased.

The second current sensor 5 is provided within the DC/DC converter 4, and measures the sum total of currents flowing in the accessories 9 through the DC/DC converter 4. The second current sensor 5 outputs measured values to the controller 7 as a signal.

The controller 7 computes the SOC of the battery 1 based on the current measured by the first current sensor 3 and the current measured by the second current sensor 5. Driving of the motor/generator 6 and the accessories 9 is then controlled based on the computed SOC.

Figure 2:
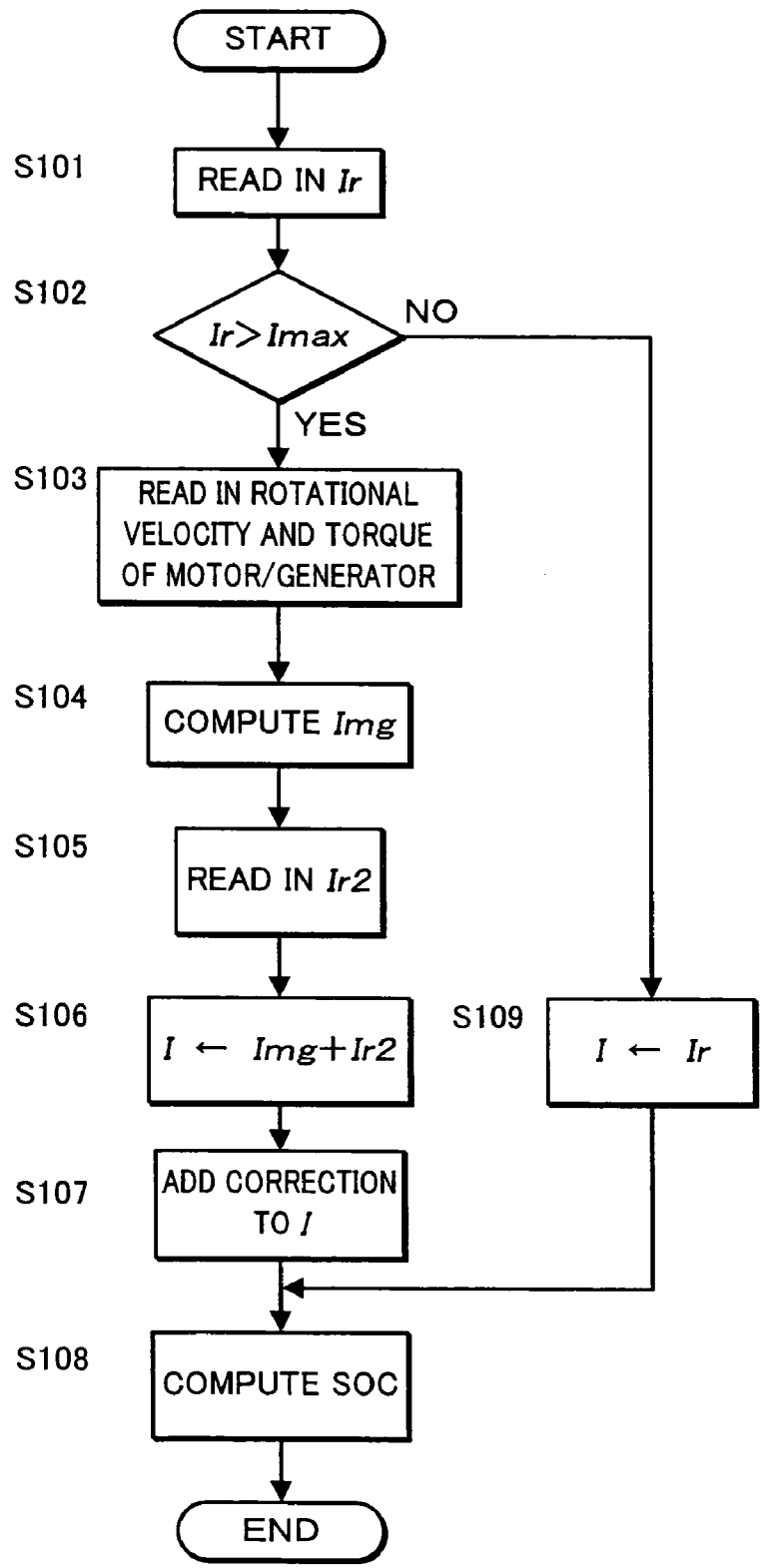
FIG. 2 is a flowchart that explains an SOC computation routine executed by a controller according to this invention.

Referring to FIG. 2, an SOC computation routine performed by the controller 7 is explained. The routine is repeatedly performed at intervals of 10 milliseconds when motor driver circuit is active.

In a step S101, the controller 7 reads in a detected value Ir from the first current sensor 3.

In a step S102, the controller 7 determines whether or not the detected value Ir is larger than the upper limit value Imax of the rated discharge range.

When the detected value Ir is larger than the upper limit value Imax, in a step S103, the controller 7 reads in the rotational velocity and the torque of the motor/generator 6. The controller 7 controls the rotational velocity and the torque of the motor/generator 6 by outputting the motor/generator control command as described above. Accordingly, the values are already known to the controller 7 from this command.

In a step S104, the controller 7 computes an estimated current value Img for the current flowing from the battery 1 to the motor/generator 6. The output power of the motor/generator 6 can be computed based on the rotational velocity and the torque of the motor/generator 6. Output losses in the motor/generator 6 and in the inverter 8 can be estimated based on the computed output power of the motor generator 6. Accordingly, the value Img for the discharge current from the battery 1 to the motor/generator 6 can be estimated by adding the output losses to the output power of the motor/generator 6.

In a step S105, the controller 7 reads in a detected value Ir2 of the second current sensor 5.

In a step S106, the controller 7 calculates the sum of the estimated current value Img for the current discharged from the battery 1 to the motor/generator 6 and a detected current Ir2 from the second current sensor 5 as a discharge current I of the battery 1. The estimation precision can thus be increased by computing the discharge current I of the battery as the sum of the estimated current Img and the detected current Ir2 as compared to the case of relying entirely on estimation in computing the discharge current I of the battery 1.

In a step S107, the controller 7 applies a delay correction to the discharge current I of the battery 1 computed in the step S106. The discharge current I of the battery 1 includes the estimated current Img of the current discharged from the battery 1 to the motor/generator 6. The controller 7 computes the estimated current Img based on the rotational velocity and the torque of the motor/generator 6, but the actual discharge current is caused to delay with respect to the above described motor/generator control command. Accordingly, it is necessary to correct the delay. Details of the delay correction method are described later.

In a step S108, the controller 7 computes the SOC of the battery 1 based on the discharge current I of the battery 1 corrected in the step S107 to finish the processing. Specifically, the controller 7 computes the SOC of the battery 1 by integrating the discharge current I of the battery 1.

When the controller 7 determines in the step S102 that the detected value Ir is equal to or less than the upper limit value Imax, in a step S109, the detected current value Ir from the first current sensor 3 is set as the discharge current I of the battery 1, and processing proceeds to the step S108.

Figure 3:
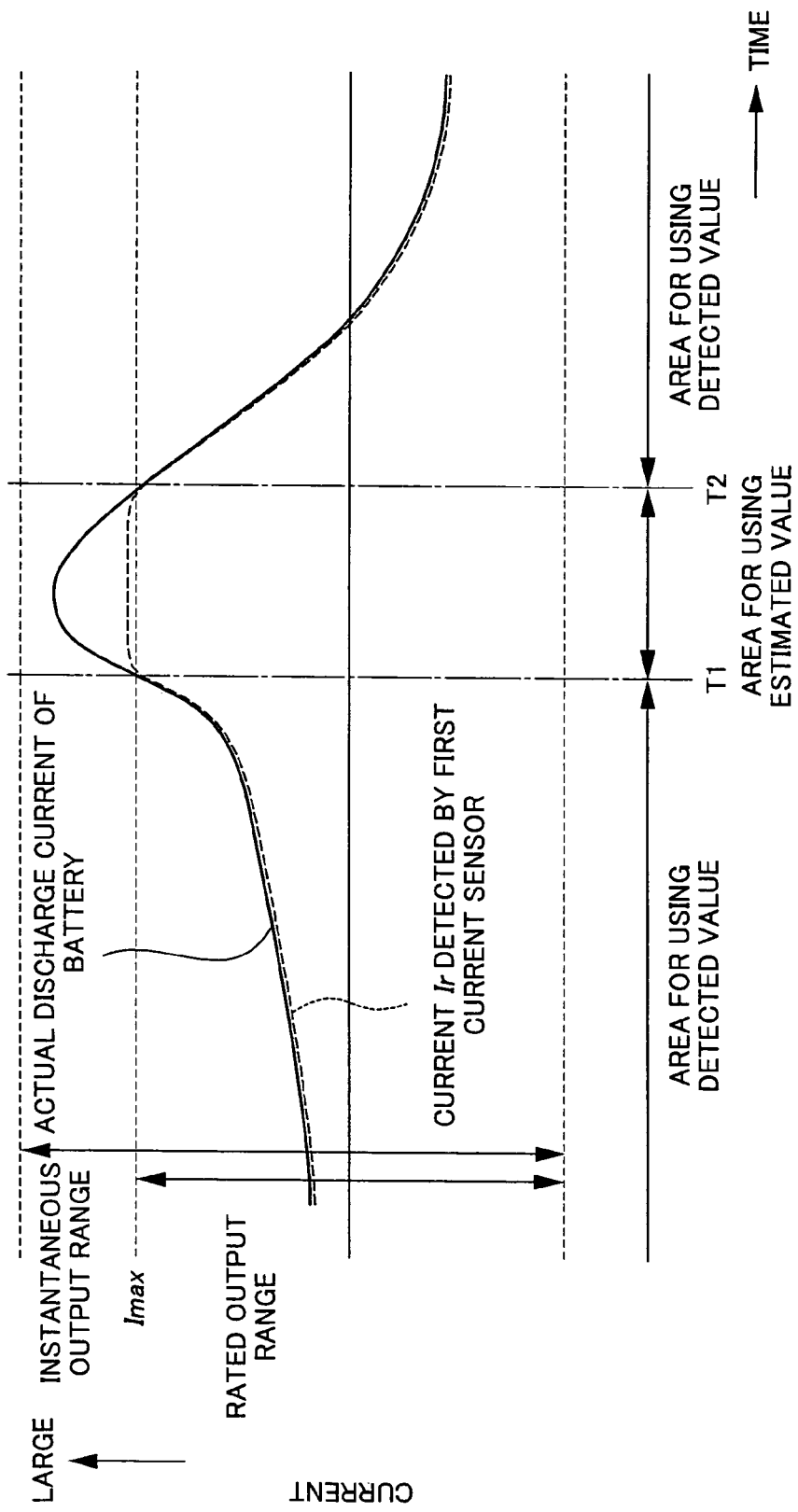
FIG. 3 is a timing chart that explains changes of an actual discharge current for a battery and a current Ir detected by a first current sensor according to this invention.

Referring to FIG. 3, changes of the actual discharge current of the battery 1 and the detected current I from the first current sensor 3 are explained. When the actual discharge current of the battery 1 is in the rated discharge range, the detected current value Ir from the first current sensor 3 is substantially equal to the actual discharge current of the battery 1. When the actual discharge current of the battery 1 increases and exceeds the upper limit value Imax of the rated discharge range at a time T1, the detected current Ir from the first current sensor 3 also exceeds the upper limit value Imax of the measurable range and shortly it will reach the upper limit of the measurable range. Thereafter, a value that is slightly higher than the upper limit value Imax of the rated discharge range is output as the detected value.

In the routine of FIG. 2, the determination of the step S102 becomes affirmative when the actual discharge current of the battery 1 has exceeded the upper limit value Imax, and the controller 7 estimates the current I of the battery 1 according to the steps S103 to S107 of FIG. 2. Thereafter, when the actual discharge current of the battery 1 decreases and becomes less than the upper limit value Imax at a time T2, the determination of the step S102 changes to negative, and in the step S109, the controller 7 employs the detected current Ir from the first current sensor 3 as the discharge current I of the battery 1.

In other words, the controller 7 computes the SOC by taking the detected current Ir from the first current sensor 3 as the discharge current I of the battery 1 before the time T1 and after the time T2. From the time T1 to the time T2, the controller 7 computes the SOC by taking the discharge current estimated according to the steps S103 to S107 of FIG. 2 as the discharge current I of the battery 1. By thus limiting the time that the estimated current value is employed as the discharge current I used in computing the SOC, estimation errors can be kept to a minimum, and the SOC can be computed with good precision.

Figure 4:
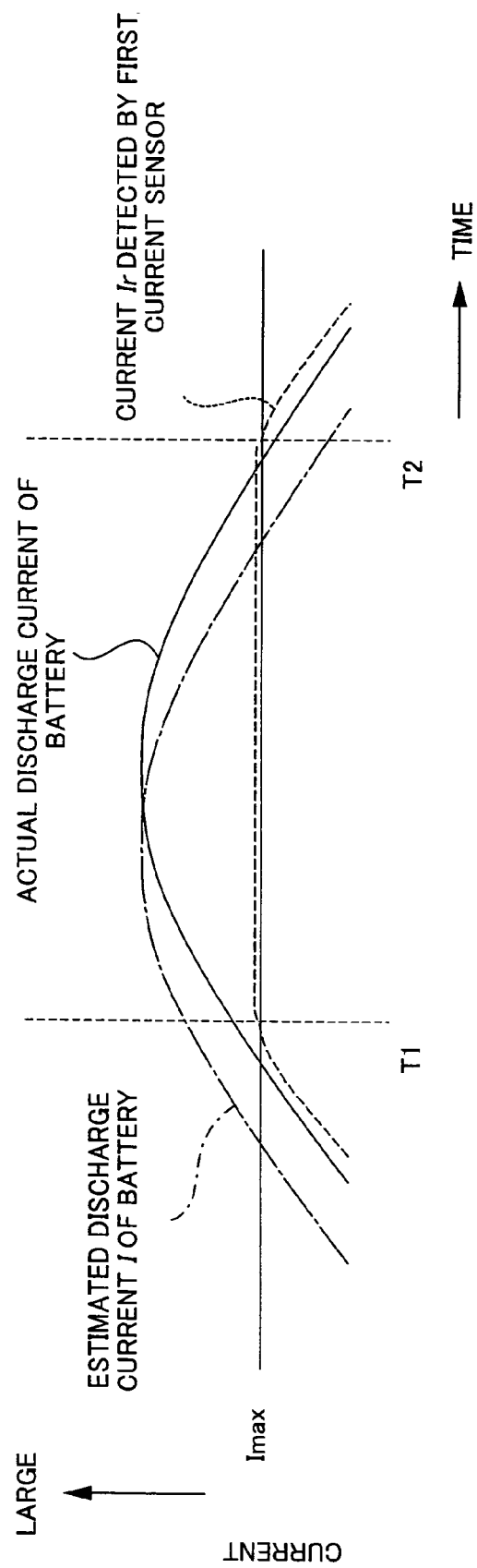
FIG. 4 is a timing chart that explains an error between an estimated discharge current I and an actual discharge current of the battery.

Referring to FIG. 4, errors between the estimated discharge current and the actual discharge current when the discharge current I of the battery 1 is estimated based on the motor/generator control command, are explained.

As described above, the actual discharge current of the battery 1 follows the motor/generator control command with a delay. Accordingly, errors exist between the estimated discharge current value I computed from the motor/generator control command from the controller 7 to the motor/generator 6 and the actual discharge current. An accurate value therefore cannot be computed when the SOC is directly computed from the estimated discharge current I.

The processing performed in the step S107 of FIG. 2 is performed in order to increase the estimation precision for the actual discharge current of the battery 1 by applying a correction relating to this delay to the discharge current I.

Figure 5:
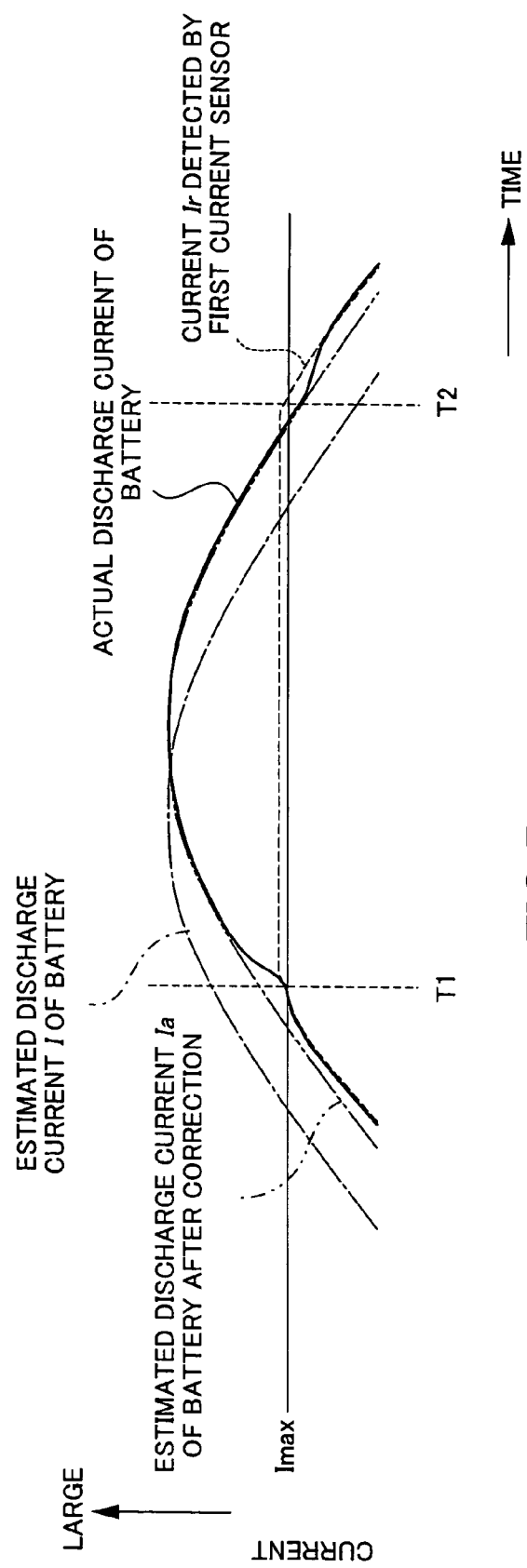
FIG. 5 is a timing chart that explains a result of correction of the estimated discharge current I of the battery.

Referring to FIG. 5, the specific contents of the delay correction for the discharge current I implemented during the step S107 are explained.

FIG. 5 shows a relationship, found by the inventors through experimentation, between an actual discharge current of a battery, and the estimated discharge current I of the battery computed by the procedures of the steps S103 to S107. The solid line in FIG. 5 shows the actual discharge current of the battery, used in computing the SOC, while the alternate long and short dash line shows the estimated discharge current I. From the experimental results, the inventors have verified that there is an error corresponding to a second-order lag and dead time between the estimated discharge current I and the actual discharge current.

Thus, in the step S107, the controller 7 adds a correction, such as a correction to the second-order lag and the dead time, to the estimated discharge current I. A known delay correction method is applied for this correction. The time constant and the dead time used in the correction are experimentally determined in advance.

An estimated discharge current Ia after the correction has been added, is shown in FIG. 5 by an alternate long and two short dashes line. As shown in FIG. 5, the estimated discharge current Ia after correction has been verified by experimentation to substantially resemble the actual discharge current of the battery 1 during the period of from the time T1 to the time T2.

In the SOC computation routine of FIG. 2, when the detected current Ir from the first current sensor 3 crosses the upper limit value Imax at the times T1 and T2, the discharge current of the battery 1 changes from the detected current Ir of the first current sensor 3 to the estimated discharge current Ia after the correction. It is preferable to limit the rate of change of the discharge current immediately before and after the time T1 and immediately before and after the time T2 so that the discharge current does not dramatically change in association with the change over of the calculation methods.

As described above, in this embodiment the measurable range of the first current sensor 3 is limited to the vicinity of the rated discharge range of the battery 1. Accordingly, the resolution of the first current sensor 3 within the measurable range can be increased, and the measurement precision can be increased.

On the other hand, when the actual discharge current of the battery 1 exceeds the upper limit value Imax of the rated discharge range, the actual discharge current value of the battery 1 is estimated based on the rotational velocity and the torque of the motor/generator 6, which are obtained from motor/generator control commands. Accordingly, the SOC can be computed with favorable precision over the entire discharge range of the battery 1, using the first sensor 3 that has a relative narrow measurable range but with a high resolution.

The duration of time that the battery discharge current exceeds the rated discharge range is generally short compared to the duration of time that the battery discharge current is within the rated discharge range. Consequently, the duration of time that the measured current is used as the current I for computing the SOC is long compared to the duration of time that the estimated current is used. According to this invention, the measured current is used as often as possible. The computation precision for the SOC can thus be kept high.

In the device described above, when the detected current from the first current sensor 3 exceeds the upper limit value Imax of the rated discharge range, of the entire discharge current of the battery 1, the value Img of the current discharged to the motor/generator 6 is estimated based on the rotational velocity and the torque of the motor/generator 6. The current discharged to the accessories 9, other than to the motor/generator 6, is detected by the second current sensor 5. Therefore the current value can be computed more accurately than when making computations relying only upon the estimation, and, accordingly, the SOC computation precision can be increased.

In the embodiment described above, control of the inverter 8 and computation of the SOC are performed at the same time by the controller 7. However, it is also possible to perform control of the inverter 8 and computation of the SOC by using separate controllers or microcomputers.

In the embodiment described above, parameters necessary in computing the SOC are detected by using the first current sensor 3 and the second current sensor 5. This invention does not depend upon the method employed in acquiring the parameters, however, and is also applicable to any SOC detection device or detection method that makes the claimed computations by using the parameters.

The embodiment described above shows this invention as applied to a motor/driver circuit of a hybrid-drive vehicle or an electric automobile. This invention can also be applied to motor driver circuits other than those of vehicles, and favorable operational effects similar to those of the embodiment described above can also be obtained for such motor driver circuits.

The contents of Japanese patent application 2004-174055 with a filing date of Jun. 11, 2004 in Japan are hereby incorporated by reference.

Although the invention has been described above by reference to certain embodiments of the invention, the invention is not limited to the embodiments described above. Modifications and variations of the embodiments described above will occur to those skilled in the art, within the scope of the claims.

The embodiments of this invention in which an exclusive property or privilege is claimed are defined as follows:

What is claimed is:

1. A battery state of charge detection device for use with an electric circuit that drives a motor by using a current supplied from a battery, the electric circuit comprising an inverter that controls operation of the motor and a controller that outputs a motor control signal to the inverter to supply from the battery to the motor a current corresponding to a requested output to the motor, the battery having a rated discharge range relating to a discharge current, the battery state of charge detection device comprising:
 a first current sensor that detects a discharge current of the battery, the first current sensor having a measurable current range that slightly exceeds an upper limit value of the rated discharge range; and
 a microprocessor programmed to:
  determine whether or not the current detected by the first current sensor exceeds the upper limit value;
  compute a state of charge of the battery based on the motor control signal when the current detected by the first current sensor exceeds the upper limit value; and
  compute the state of charge of the battery based on a current value detected by the first current sensor when the current detected by the first current sensor does not exceed the upper limit value.

2. The battery state of charge detection device as defined in claim 1, wherein the battery further has an instantaneous rated discharge range having an upper limit value larger than the upper limit value of the rated discharge range, and wherein the microprocessor is further programmed to compute the state of charge of the battery based on the motor control signal within a current value interval from the rated discharge range to the instantaneous rated discharge range.

3. The battery state of charge detection device as defined in claim 1, wherein the motor control signal is a signal that indicates a rotational velocity and a rotational torque of the motor, and wherein the microprocessor is further programmed to estimate an amount of current supplied to the motor based on the rotational velocity and the rotational torque, and to compute the state of charge of the battery based on the estimated amount of current supplied to the motor.

4. The battery state of charge detection device as defined in claim 1, wherein the electric circuit further comprises an electrical load, separate from the motor, that consumes the current supplied from the battery, wherein the detection device further comprises a second current sensor that detects a current supplied from the battery to the load, and wherein the microprocessor is further programmed to compute the state of charge of the battery based on the sum of a current supplied to the motor estimated from the motor control signal, and the current supplied to the load detected by the second current sensor, when the current detected by the first current sensor exceeds the upper limit value.

5. The battery state of charge detection device as defined in claim 1, wherein the controller and the microprocessor comprise the same microcomputer.

6. A battery state of charge detection device for use with an electric circuit that drives a motor by using a current supplied from a battery, the electric circuit comprising an inverter that controls operation of the motor and a controller that outputs a motor control signal to the inverter to supply from the battery to the motor a current corresponding to a requested output to the motor, the battery having a rated discharge range relating to a discharge current, the battery state of charge detection device comprising:
   means for detecting a discharge current of the battery, the discharge current detecting means having a measurable current range that slightly exceeds an upper limit value of the rated discharge range; and
   means for determining whether or not the current detected by the discharge current detecting means exceeds the upper limit value;
   means for computing a state of charge of the battery based on the motor control signal when the current detected by the discharge current detecting means exceeds the upper limit value; and
   means for computing the state of charge of the battery based on a current value detected by the discharge current detecting means when the current detected by the discharge current detecting means does not exceed the upper limit value.

7. A battery state of charge detection method using an electric circuit that drives a motor by using a current supplied from a battery, the electric circuit comprising an inverter that controls operation of the motor and a controller that outputs a motor control signal to the inverter to supply from the battery to the motor a current corresponding to a requested output to the motor, the battery having a rated discharge range relating to a discharge current, the battery state charge detection method comprising:
   detecting a discharge current of the battery by using a current sensor having a measurable current range that slightly exceeds an upper limit value of the rated discharge range;
   determining whether or not the current detected by the current sensor exceeds the upper limit value;
   computing a state of charge of the battery based on the motor control signal when the current detected by the current sensor exceeds the upper limit value; and
   computing the state of charge of the battery based on a current value detected by the current sensor when the current detected by the current sensor does not exceed the upper limit value.

* * * * *